(12) United States Patent
Shih

(10) Patent No.: US 7,106,577 B2
(45) Date of Patent: Sep. 12, 2006

(54) CIRCUIT BOARD GROUP FOR ELECTRICALLY COUPLING ELECTRONIC DEVICES

(75) Inventor: Shoei-Yuan Shih, Taipei Hsien (TW)

(73) Assignee: Evserv Tech Corporation, Taipei Hsien (TW)

( * ) Notice: Subject to any disclaimer, the term of this patent is extended or adjusted under 35 U.S.C. 154(b) by 68 days.

(21) Appl. No.: 10/892,173

(22) Filed: Jul. 16, 2004

(65) Prior Publication Data

US 2006/0012950 A1   Jan. 19, 2006

(51) Int. Cl.
*G06F 1/16* (2006.01)
*H05K 7/14* (2006.01)

(52) U.S. Cl. .................. 361/679; 361/707; 312/223.6; 248/535

(58) Field of Classification Search ........ 361/679–687, 361/724–727, 700, 704, 707; 312/223.1–223.6; 248/65, 73, 534–535
See application file for complete search history.

(56) References Cited

U.S. PATENT DOCUMENTS

| 6,388,873 | B1 * | 5/2002 | Brooks et al. ............. 361/685 |
| 6,392,884 | B1 * | 5/2002 | Chou ......................... 361/687 |
| 6,950,304 | B1 * | 9/2005 | Suzuki et al. ............. 361/687 |
| 2003/0112596 | A1 | 6/2003 | Shih |
| 2003/0147210 | A1 | 8/2003 | Shih |

\* cited by examiner

*Primary Examiner*—Hung Van Duong
(74) *Attorney, Agent, or Firm*—Birch, Stewart, Kolasch & Birch, LLP

(57) ABSTRACT

The present invention discloses a circuit board group for electrically coupling electronic devices, which comprises a circuit board group having a primary circuit board and at least one secondary circuit board. A second connection port coupled to a first connection port is disposed on the secondary circuit board at the corresponding side of the primary circuit board, and a third connection port coupled to an electronic device is disposed on the other side, and the number of the third connection ports corresponds to that of the electronic devices. The present invention increases the number of installable electronic devices by increasing the number of third connection ports.

8 Claims, 7 Drawing Sheets

CIRCUIT BOARD GROUP FOR ELECTRICALLY COUPLING ELECTRONIC DEVICES

FIELD OF THE INVENTION

The present invention relates to a circuit board group constituting an electrical connection of an electronic device, more particularly to an electronic device array, a power supply array or a server that increases the number of installable electronic devices by means of a circuit board group capable of installing a primary circuit board and a secondary circuit board and either circuit board can be installed in the same space.

BACKGROUND OF THE INVENTION

To overcome the existing limitation on the specification of servers, the present related industry spares no efforts to reduce the area for installing each of the required components of the server, and greatly increases the number of installable disk drives, and thus maximizing the performance of the server.

The inventor of the present invention also filed an application and was granted with the U.S. Patent Publication NO. 2003-0112596A1 entitled "Server with four hard disk drives". The invention disclosed an 1 U 19-inch server specification capable of installing four standard 3.5-inch hard disk drives. The inventor of the present invention also filed the U.S. Patent Publication No. 2003-0147210A1 entitled "Server chassis with control panel" that can change the position of the control panel to expand the number of installable disks. However, the computation speed of a computer in actual practice is increasing day after day and thus only 9~12 disks are no longer sufficient for the practical application. The method of maximizing the number of installable disk drives under the condition of unable to further expand the server while complying with the existing server specification demands immediate attention and improvement.

After a 2.5-inch hard disk drive of a smaller volume specification having the performance of a 3.5-inch hard disk drive of a larger volume specification is introduced, the foregoing problem is solved. For example, the traditional disk array 1' as shown in FIG. 1 can install 16 sets (4×4) of the 3.5-inch hard disk drives, but it can install 30 sets (6×5) of 2.5-inch hard disk drives in the same space as shown in FIG. 4. The new specification can greatly improve the storage capacity of the disk array 1'. However, it is found that if the circuit board 20' used for the traditional disk array 1' is adopted, then the number of connection ports 205' on the circuit board has to be increased accordingly because the number of hard disk drives 10' is increased. Therefore, there remains no more space on the circuit board 20' for the layout of the circuitry, and thus it is a major factor that the 2.5-inch hard disk cannot be used for the disk array 1' in the present industry.

SUMMARY OF THE INVENTION

The primary objective of the present invention is to overcome the foregoing shortcoming and avoid the exiting deficiency. The present invention abandons the single circuit board design, but it uses a circuit board group comprised of a primary circuit board having a first connection port and at least one secondary circuit board instead. A second connection port coupled to the corresponding first connection port is disposed on the secondary circuit board at a position corresponding to the circuit section, and a third connection port is coupled to another side of the secondary circuit board corresponding to the electronic device and the number of third connection ports matches the number of electronic devices. The present invention increases the number of third connection ports in order to accommodate more electronic devices, and the circuit for connecting each electronic device is laid on the primary circuit board. The foregoing arrangement can solve the layout issue and effectively provides the expansion for more electronic devices.

Another objective of the present invention resides on that the primary circuit board can be divided into an electronic device connecting section and a secondary circuit connecting section, and the electronic device connecting section comprises a fourth connection port for connecting an electronic device, and the fourth connection port is parallel to the third connection port after the primary circuit board is connected with the secondary circuit board, such that the electronic device can be electrically connected to the fourth connection port and the third connection port at the same interface position.

A further objective of the present invention is to provide an electronic device array or a server that can be used in a disk array or a power supply array.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 4 is a cross-sectional view of Section 3—3 as depicted in

DETAILED DESCRIPTION OF THE PREFERRED EMBODIMENTS

To make it easier for our examiner to understand the objective of the invention, its structure, innovative features, and performance, we use a preferred embodiment and the attached drawings for the detailed description of the invention.

Figure 1:
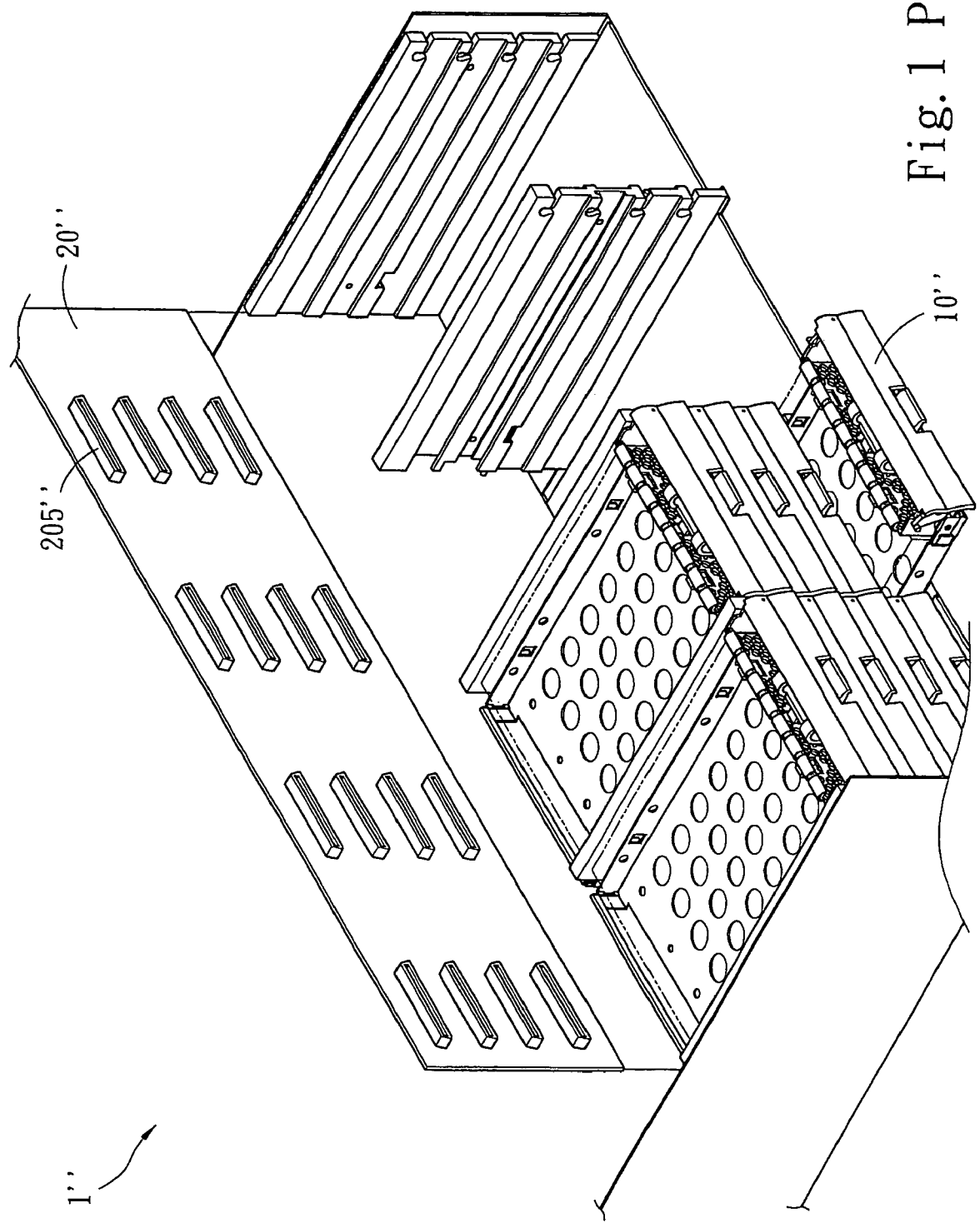
FIG. 1 is an illustrative view of a prior-art floppy disk array.
Figure 2:
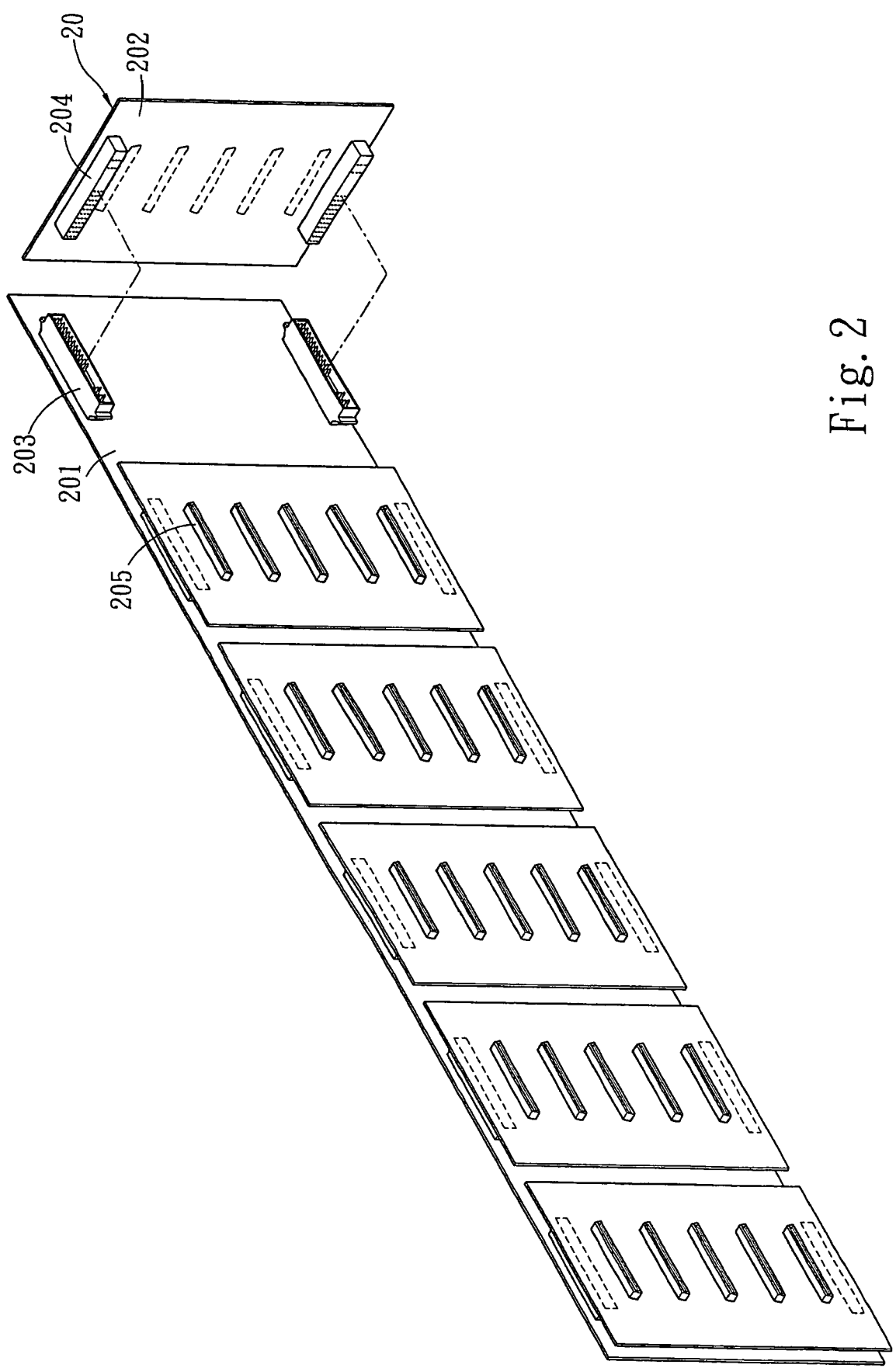
FIG. 2 is an illustrative view of the disassembled parts of the structure of the present invention.
Figure 3:
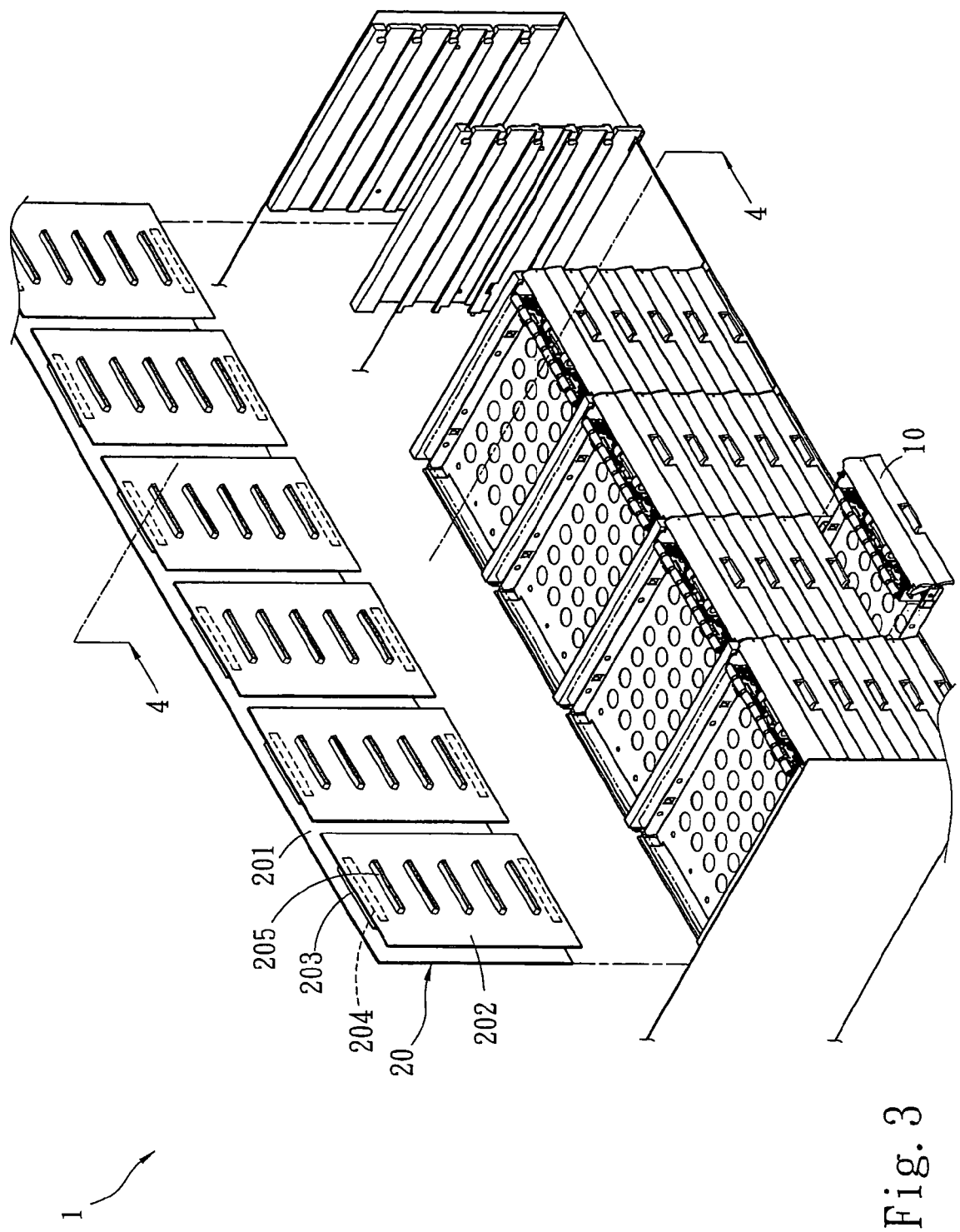
FIG. 3 is an illustrative view of the assembly of the present invention.

Please refer to FIGS. 2 and 3 for the illustrative view of the dissembled structure and the assembled floppy disk array of the present invention respectively. In the figures, the present invention relates to a circuit board group 20 for electrically coupling an electronic device that defines an electronic connection after a plurality of electronic devices 10 is coupled to the circuit board group 20. The foregoing electronic device 10 is a disk array 1 comprised of a plurality of hard disk drives or a power supply array comprised of a plurality of power supplies. The following embodiments adopt the 2.5-inch hard disk drive as the electronic device 10 installed to a disk array 1.

The circuit board group 20 according to the present invention comprises a primary circuit board 201 having a first connection port 203. Besides the circuitry layout such as a circuit with logical operations for related processing functions and an electronic component such as an integrated circuit (IC) for related processing functions is coupled to the first connection port 203, the primary circuit board 201 at its front end comprises at least one secondary circuit board 202. A second connection port 204 coupled to the first connection port 203 is disposed on said secondary circuit board 202 at a side corresponding to the primary circuit board 201. Since the secondary circuit board 202 requires less circuit such as the function for power supply, therefore a third connection port 205 is disposed on the other side which has a larger connecting area for installing a number of third connection ports 205 for the corresponding number of electronic devices 10.

Figure 4:
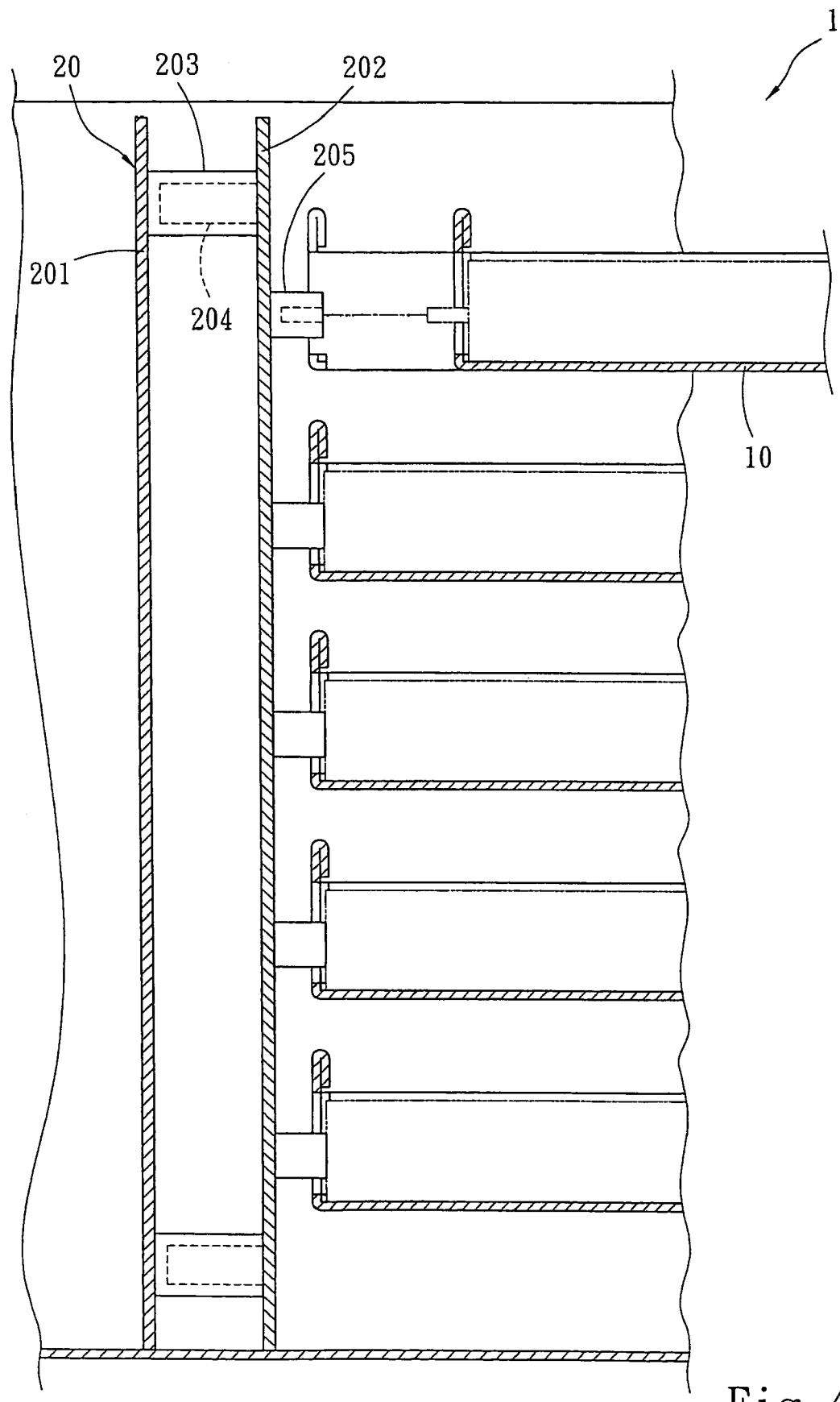

Please also refer to FIG. 4. If a user connects the second connection port 204 with the first connection port 203 for the secondary circuit board 202, so that the secondary circuit board 22 is electrically connected to the primary circuit board 201, then the user can connect an electronic device 10 (such as a 2.5-inch hard disk drive) to the corresponding third connection port 205.

From the description above, it is clear that the present invention can effectively expand the number of hard disk drives 10 and drastically increases the storage capacity of the disk array 1. As to the circuit layout, the secondary circuit board 202 does not have extra space for the circuit layout and the installation of electronic components, but after the first connection port 203 and the second connection port 204 are connected, the second circuit board 204 will send electronic signals to the primary circuit board 201 for the processing. Therefore, the present invention can effectively solve the tough problems of the circuit layout for the traditional single circuit board, and maximize the performance of the electronic device having a small volume specification and greatly enhance the economic benefits for the industrial applications.

Figure 5:
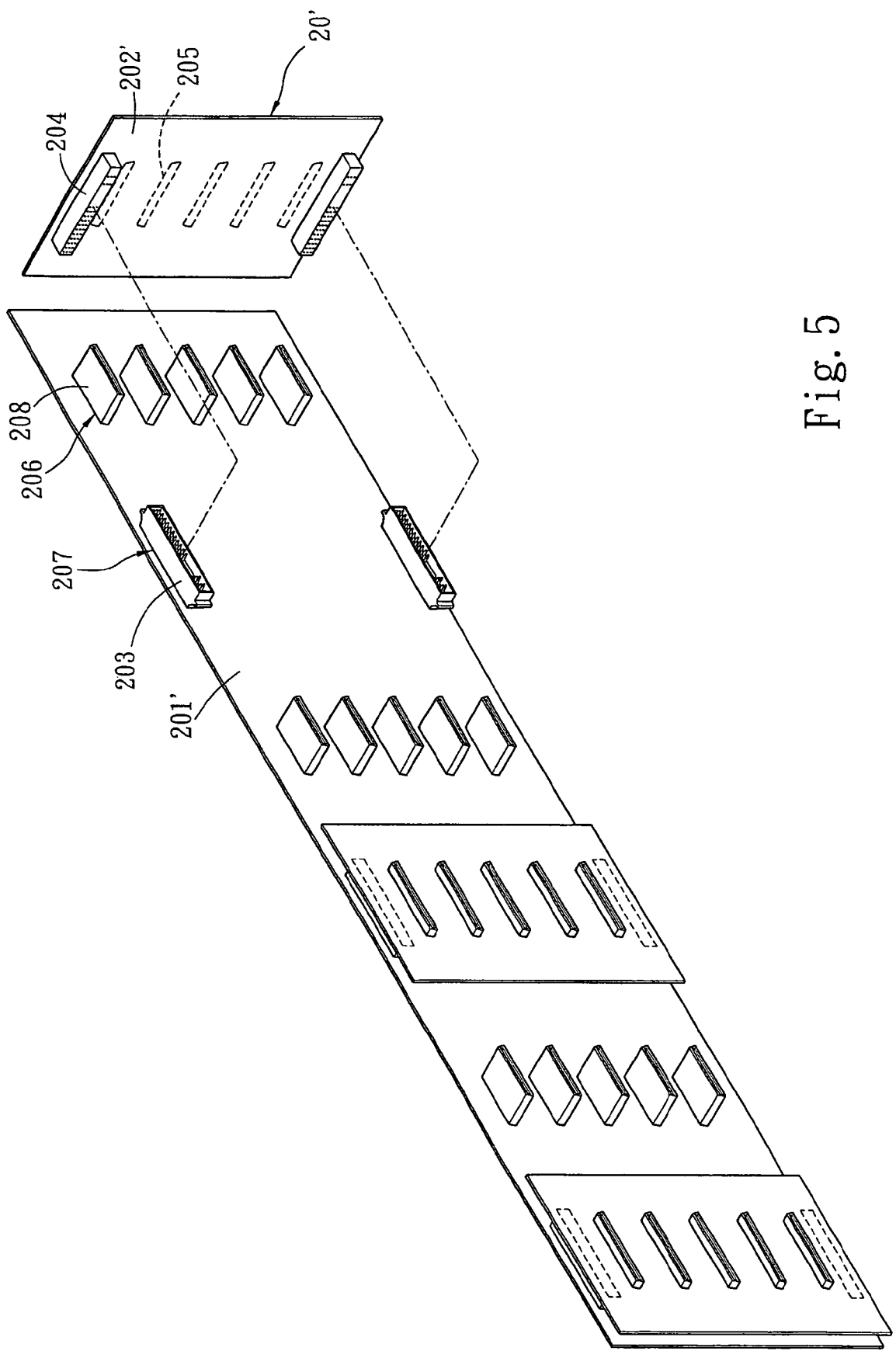
FIG. 5 is an illustrative view of the disassembled structure of a second preferred embodiment of the present invention.
Figure 6:
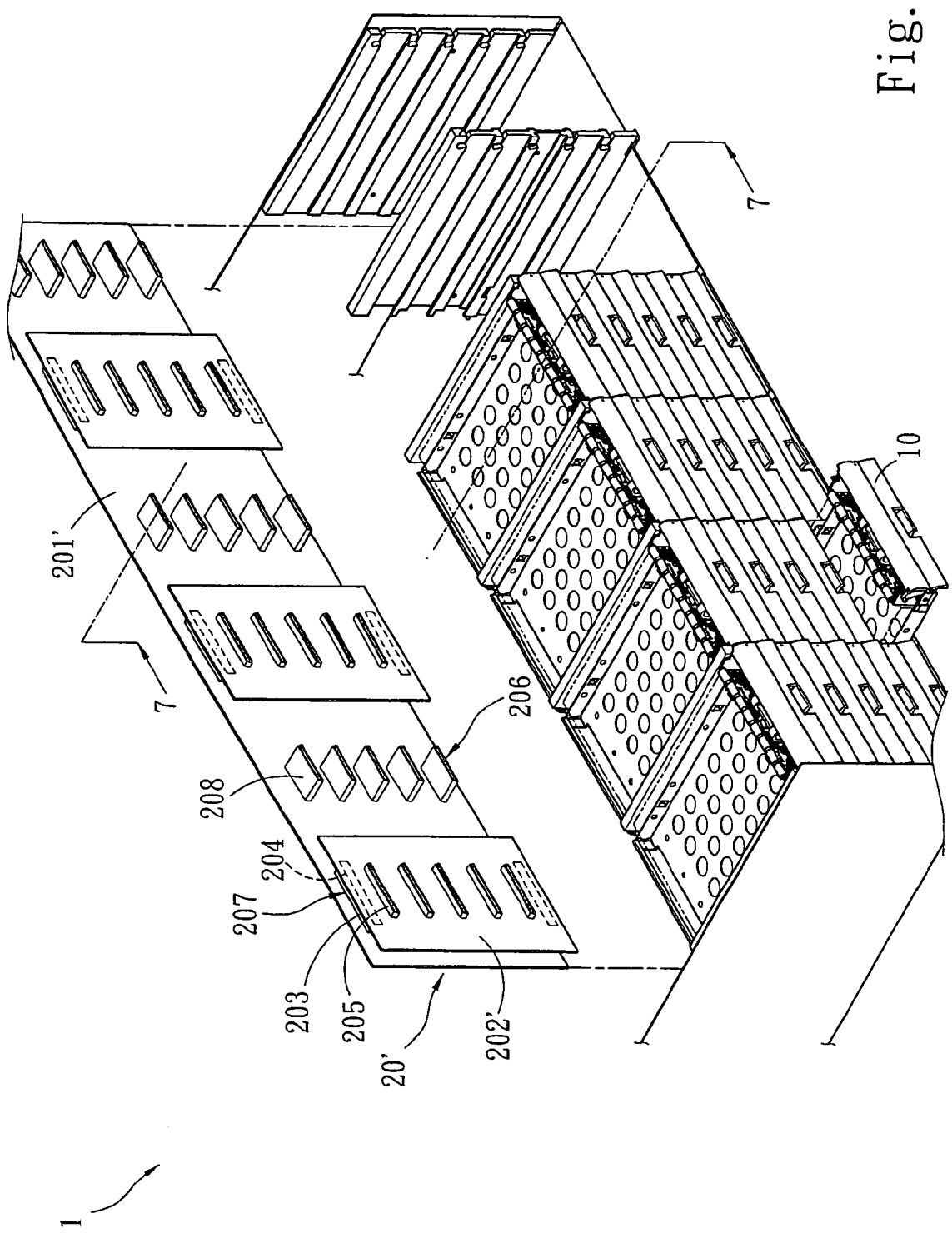
FIG. 6 is an illustrative view of the assembled floppy disk array according to the second preferred embodiment of the present invention.
Figure 7:
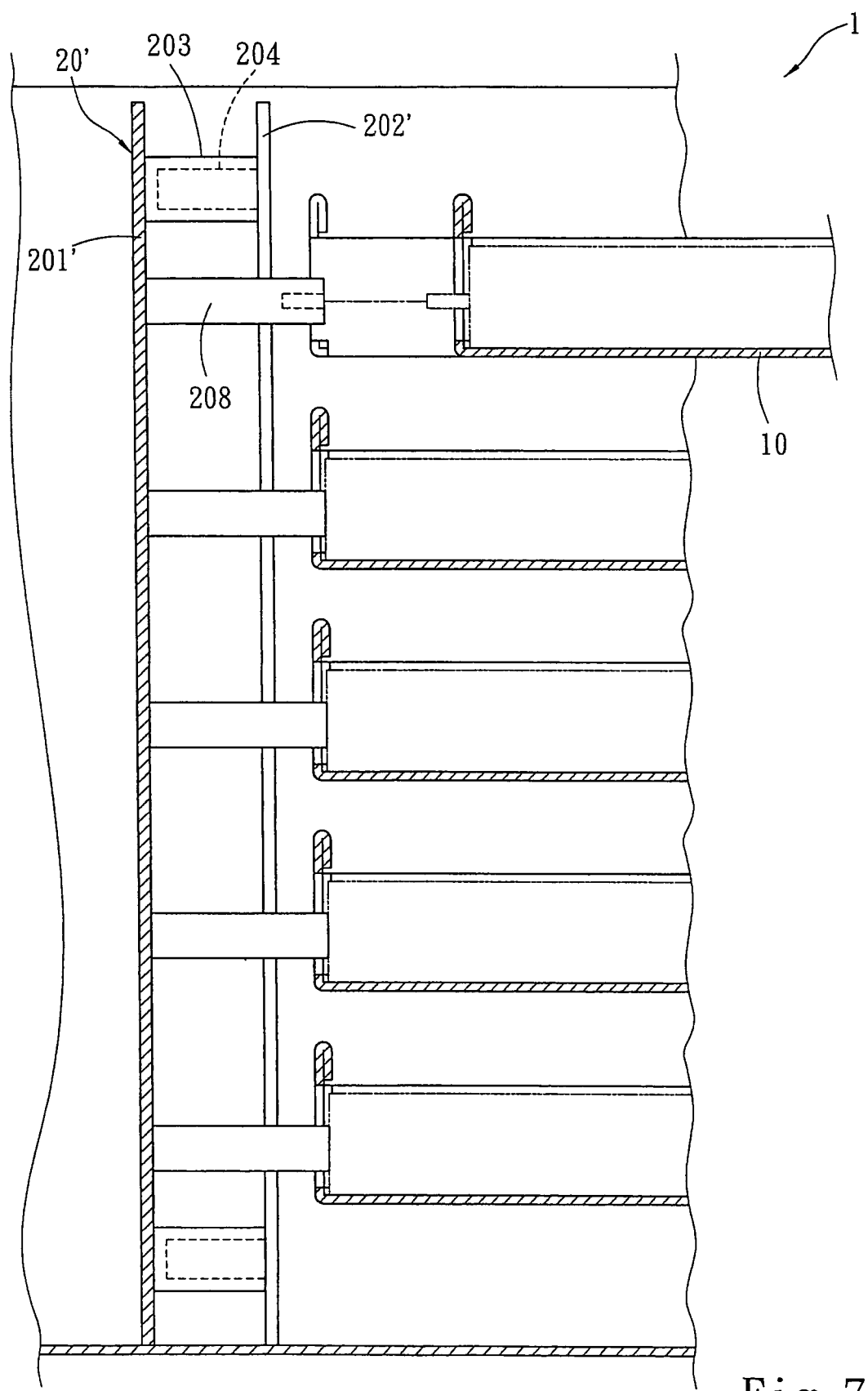
FIG. 7 is a cross-sectional view of Section 6—6 as depicted in FIG. 6.

Please refer to FIGS. 5, 6 and 7 for the perspective view of the disassembled structure, the assembled structure of the disk array and the cross-sectional view of the assembled structure of the present invention respectively. In the figures, this embodiment discloses another mode for installing the primary circuit board 201' and the secondary circuit board 202'. The primary circuit board 201' of the invention can be divided into an electronic device connecting section 206 and the secondary circuit board connecting section 207, and the electronic device connecting section 206 comprises a fourth connection port 208 for coupling an electronic device 10, wherein the fourth connection port 208 and the secondary circuit board 202' are connected to the primary circuit board 201', and the fourth connection port 208 will be parallel to the third connection port 205 after the connection, so that the electronic device 10 can be electrically connected to the fourth connection port 208 and the third connection port 205 at the same interface position, and the circuit and electronic components are laid on the primary circuit board 201' at a position corresponding to the secondary circuit board 202'. The technical solution and its objectives are the same as those of the first preferred embodiment, and thus will not be described here.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit board group for electrically coupling electronic devices, defining an electric connection for a plurality of electronic devices after said plurality of electronic devices being coupled to said circuit board group, and said circuit board group comprising:
   a primary circuit board, having a plurality of first connection ports;
   at least two secondary circuit boards each having a second connection port coupled to one of the first connection ports and being disposed on the corresponding side of said primary circuit board and a third connection port on each of the secondary circuit boards coupled to an electronic device and the number of said third connection ports corresponding to the number of said electronic devices.

2. The circuit board group for electrically coupling electronic devices of claim 1, wherein said primary circuit board is divided into an electronic device connecting section and a secondary circuit board connecting section, and said electronic device connecting section comprises a fourth connection port for coupling an electronic device.

3. The circuit board group for electrically coupling electronic devices of claim 1, wherein said electronic device is a disk array comprised of a plurality of hard disk drives.

4. The circuit board group for electrically coupling electronic devices of claim 1, wherein said electronic device is a power supply array comprised of a plurality of power supplies.

5. The circuit board group for electrically coupling electronic devices of claim 1, wherein the secondary circuit boards are side-by-side.

6. The circuit board group for electrically coupling electronic devices of claim 2, wherein said fourth connection port is parallel to said third connection port after said fourth connection port and said secondary circuit board are coupled to said primary circuit board, such that said electronic device is capable of being electrically coupled to said fourth connection port and said third connection port at the same interface position.

7. The circuit board group for electrically coupling electronic devices of claim 5, wherein each of the secondary circuit boards have at least three third vertically disposed connection ports.

8. The circuit board group for electrically coupling electronic devices of claim 7, wherein the at least two secondary circuit boards include at least three circuit boards.

* * * * *